United States Patent
Seshita (10) Patent No.: US 9,054,701 B1
(45) Date of Patent: Jun. 9, 2015

(54) SEMICONDUCTOR DEVICE (71) Applicant: KABUSHIKI KAISHA TOSHIBA, Minato-Ku, Tokyo (JP)

(72) Inventor: Toshiki Seshita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/297,253

(22) Filed: Jun. 5, 2014

(30) Foreign Application Priority Data

Dec. 3, 2013 (JP) .................................. 2013-250077

(51) Int. Cl.
*H01P 1/15* (2006.01)
*H03K 17/16* (2006.01)
*H01P 1/10* (2006.01)

(52) U.S. Cl.
CPC ..................................... *H03K 17/165* (2013.01)

(58) Field of Classification Search
CPC ....................................... H01P 1/10; H01P 1/15
USPC .......................................... 333/101, 103–105
See application file for complete search history.

(56) References Cited

U.S. PATENT DOCUMENTS

| | | | | |
|---|---|---|---|---|
| 6,320,476 | B1 * | 11/2001 | Tsukahara | 333/104 |
| 6,975,271 | B2 * | 12/2005 | Adachi et al. | 343/700 MS |
| 7,265,604 | B2 * | 9/2007 | Yasuda et al. | 327/430 |
| 7,298,231 | B2 * | 11/2007 | Ikuta et al. | 333/133 |
| 7,391,282 | B2 * | 6/2008 | Nakatsuka et al. | 333/103 |
| 8,040,205 | B2 * | 10/2011 | Hatano et al. | 333/133 |
| 2012/0068785 | A1 * | 3/2012 | Seshita | 333/103 |

FOREIGN PATENT DOCUMENTS

JP 2009-027487 A 2/2009

* cited by examiner

*Primary Examiner* — Dean Takaoka
(74) *Attorney, Agent, or Firm* — Patterson & Sheridan, LLP

(57) ABSTRACT

A semiconductor device includes a switching unit that is provided on a substrate and controls selection of a high-frequency signal, a low-frequency circuit that is provided on the substrate and processes signals having a frequency lower than that of the switching unit, a first ground portion connected to a ground node of the low-frequency circuit, a ground conductor provided on the substrate, connected to the first ground portion at a first connection position, and connected to the ground node of the switching unit at a second connection position, and a second ground portion connected to the ground conductor, the second ground portion being closer to the second connection position than the first connection position.

20 Claims, 9 Drawing Sheets

SEMICONDUCTOR DEVICE

CROSS-REFERENCE TO RELATED APPLICATION

This application is based upon and claims the benefit of priority from Japanese Patent Application No. 2013-250077, filed Dec. 3, 2013, the entire contents of which are incorporated herein by reference.

FIELD

Embodiments described herein relate generally to a semiconductor device.

BACKGROUND

In the related art, multi-mode and multi-band wireless communication devices such as portable phones are being developed, and with this, the number of ports for switches that switch high-frequency signals tends to increase. Therefore, the number of pins on IC chips also increases.

In order to reduce the number of pins on this kind of IC chip, a serial-to-parallel converter, which converts serial data signals into parallel signals, is built in the IC chip.

Because the serial-to-parallel converter performs logic operations, which entail switching rectangular wave signals with values 0 and 1, the switching operations create high-frequency noise. If the high-frequency noise overlaps the frequency band of signals that are switched by the high-frequency switch within the IC chip, the high-frequency switch is adversely affected by the high-frequency switching noise.

DETAILED DESCRIPTION

Embodiments provide a semiconductor device capable of reducing high-frequency noise.

In general, according to one embodiment, there is provided a semiconductor device that includes a switching unit, a low frequency circuit, a first ground portion, a ground conductor and a second ground portion. The switching unit is provided on a substrate and is connected to a high-frequency signal node and a ground node. The low-frequency circuit is provided on the substrate. The first ground portion is connected to a ground node of the low-frequency circuit. The ground conductor is provided on the substrate, is connected to the first ground portion at a first connection position, and is connected to the ground node of the switching unit at a second connection position. The second ground portion is connected to the ground conductor and is closer to the second connection position than the first connection position.

Hereinafter, an embodiment of the present disclosure will be described with reference to the accompanying drawings.

Figure 1:
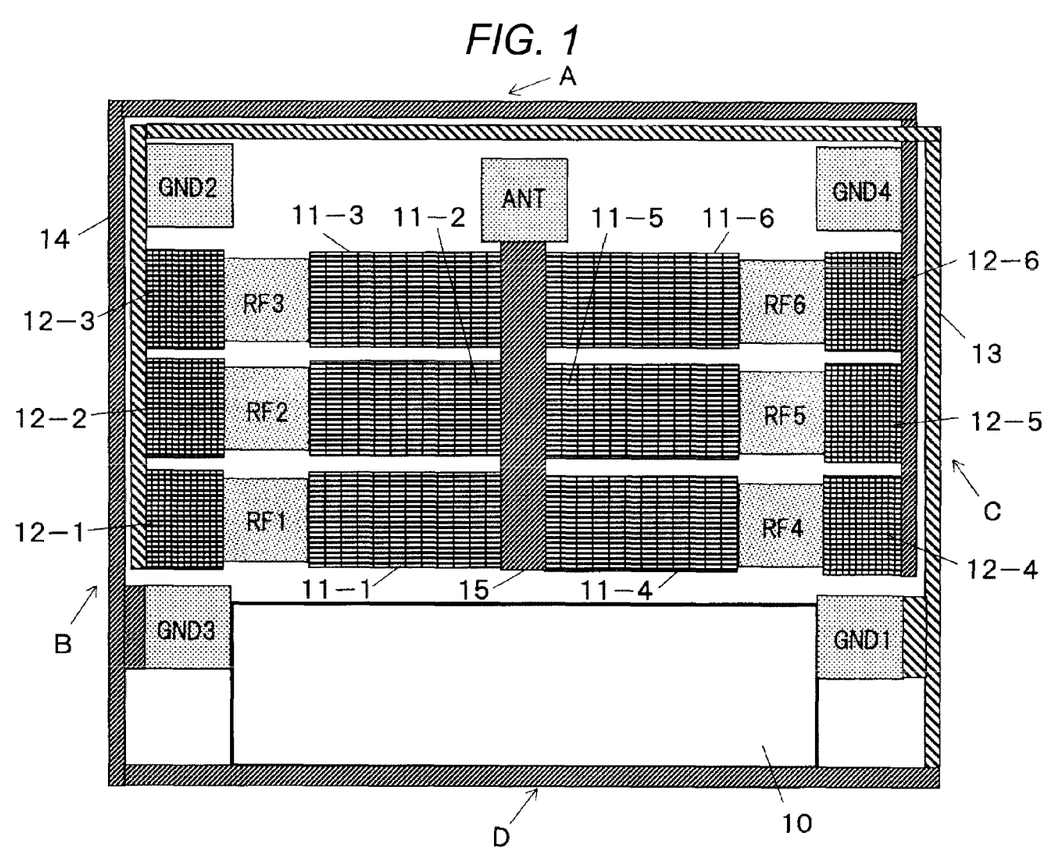
FIG. 1 is a schematic plan view of a semiconductor device according to an embodiment of the present disclosure.

FIG. 1 is a schematic plan view of a semiconductor device according to an embodiment of the present disclosure. The semiconductor device according to the present embodiment incorporates a high-frequency switch, and is configured by forming a plurality of layers, for example, on an SOI substrate. The schematic plan view of FIG. 1 shows a plan view of specific layers of the plurality of layers.

Figure 2:
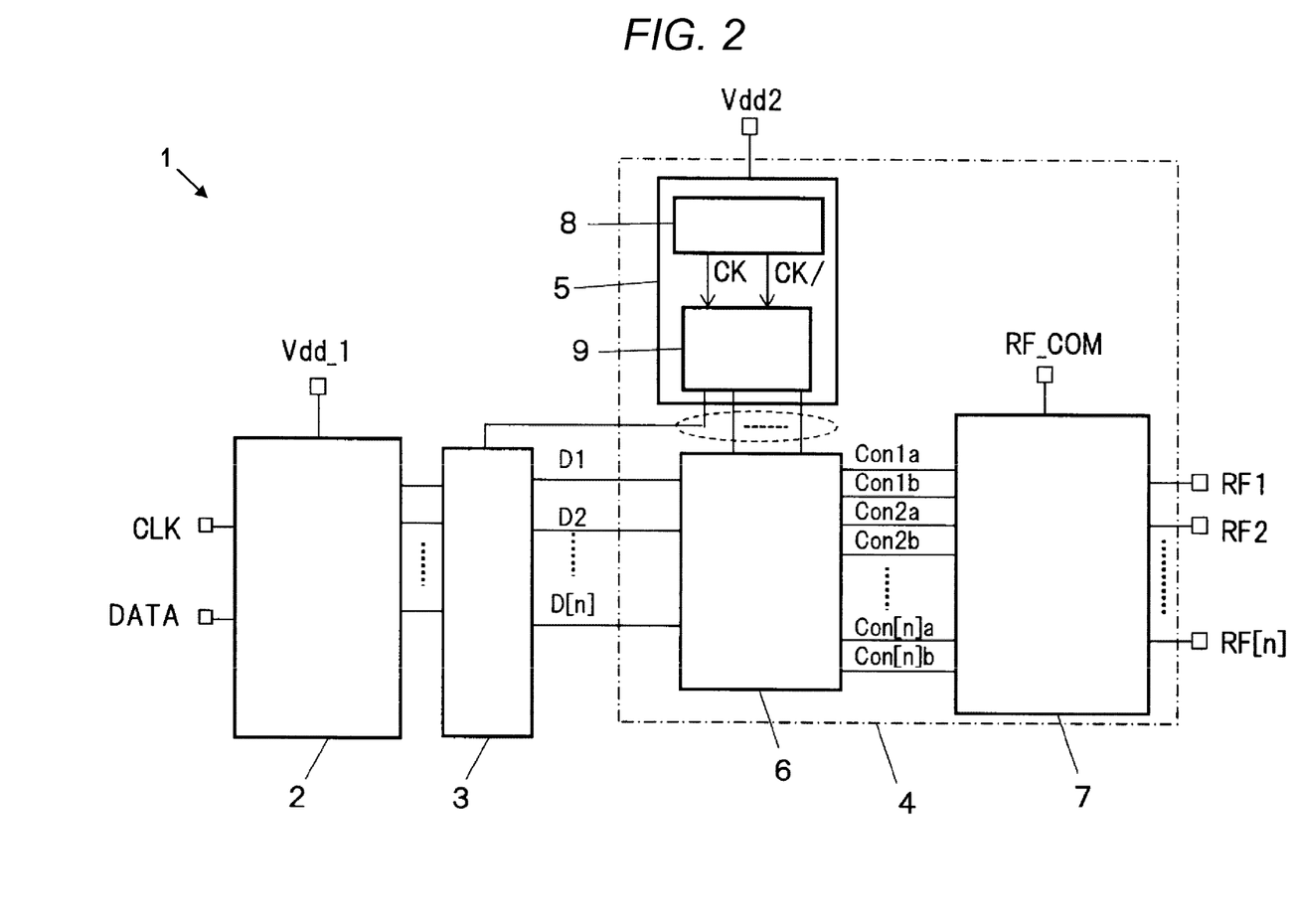
FIG. 2 is a block diagram of the schematic configuration of a semiconductor device according to the embodiment.

FIG. 2 is a block diagram illustrating the schematic configuration of the semiconductor device 1 according to the present embodiment. Before describing the schematic plan view of FIG. 1, the schematic configuration of the semiconductor device 1 according to the present embodiment is described with reference to FIG. 2.

The semiconductor device 1 of FIG. 2 includes a serial-to-parallel converter (S/P) 2, a decoder 3, and a high-frequency switch circuit 4. The serial-to-parallel converter 2 converts serial data transmitted from the outside of the semiconductor device 1 into parallel data in synchronism with a clock. The decoder 3 decodes the parallel data, thereby generating decoded signals.

The high-frequency switch circuit 4 includes a power supply circuit 5, a drive circuit 6, and a switching unit 7. The power supply circuit 5 includes an oscillation circuit 8 and a charge pump 9. The oscillation circuit 8 generates a reference oscillation signal having a predetermined frequency. The charge pump 9 performs a charging and discharging operation in synchronism with the reference oscillation signal, thereby generating an internal power supply voltage to be used by the drive circuit 6. The decoder 3 uses the output voltage of a step-down regulator (not shown) as the power supply to perform a decoding process. The drive circuit 6 converts the voltage levels of the decoded signals into control signals having voltage levels appropriate for the switching unit 7. Based on the control signals, the switching unit 7 selects one node from the input nodes RF1 to RFn to which a plurality of high-frequency signals is input, respectively, and electrically connects the selected node to the RF_COM node.

Figure 3:
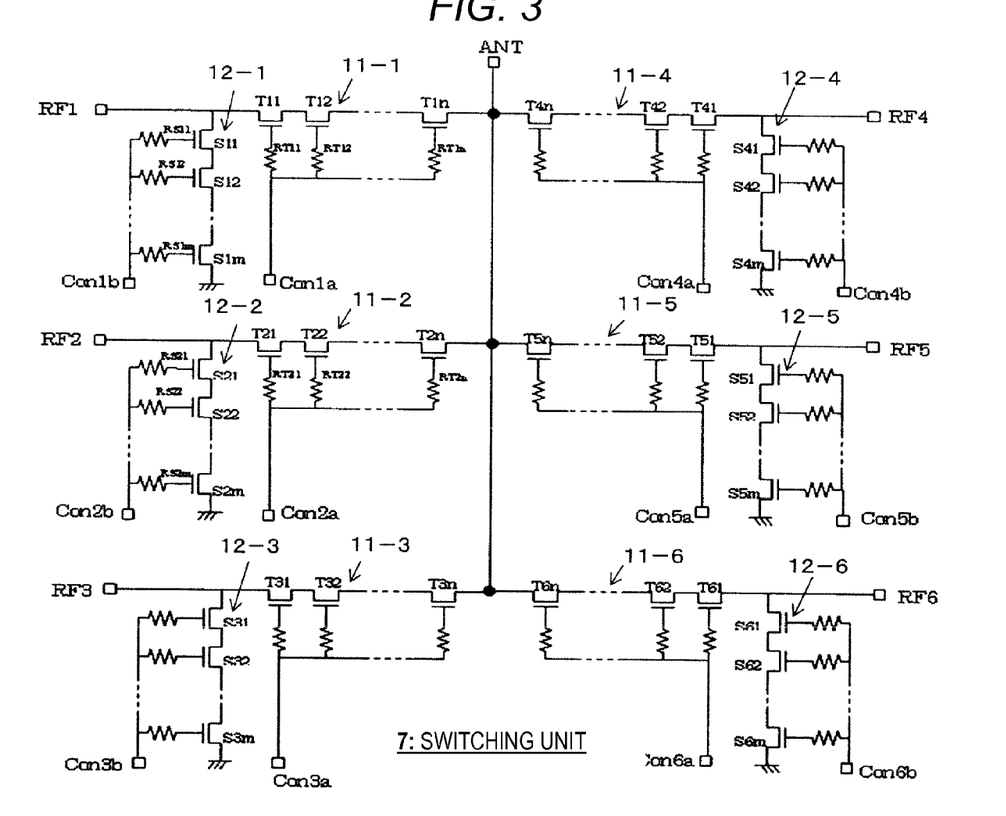
FIG. 3 is a circuit diagram illustrating an example of the internal configuration of a switching unit.

FIG. 3 is a circuit diagram illustrating an example of the internal configuration of the switching unit 7. The switching unit 7 of FIG. 3 represents an example of an SP6T switch for electrically connecting one of six high-frequency nodes RF1 to RF6 to which six high-frequency signals are received or transmitted, to an RF_COM node ANT, in response to the control signals Con1a to Con6b. However, the number of ports of the switching unit 7 is not limited to six. Also, in this disclosure, the term "node" is a concept including not only physical signal connection points such as ports and terminals but also arbitrary points on patterns or signal lines having the same potential.

The SP6T switch of FIG. 3 includes pass-through FET groups 11-1 to 11-6, each of which is configured by connecting a plurality of FETs in series between the common RF_COM node ANT and a corresponding one of the six RF nodes RF1 to RF6. The SP6T switch also includes shunt FET groups 12-1 to 12-6, each of which is configured by connecting a plurality of FETs in series between a corresponding RF node and a ground node. The threshold voltage Vth of each FET is, for example, 0 V. In this disclosure, the FET groups 11-1 to 11-6 are referred to generally as the pass-through FET groups 11, and the FET groups 12-1 to 12-6 are referred to generally as the shunt FET groups 12.

The reason that each of the pass-through FET groups 11 and the shunt FET groups 12 are configured by connecting a plurality of FETs in series is the even application of a voltage whose value is several tens of volts during transmission, to the plurality of FETs connected in series, thereby reducing the voltage that is applied to each pass-through or shunt FET.

The switching unit 7 performs switching control on GHz-band signals, whereas in the other portions of the circuit, signals are present with frequencies of several tens MHz or less. For this reason, in the schematic plan view of FIG. 1, the switching unit 7 and the other circuit portions are disposed in separate areas. Hereinafter, the circuit portions other than the switching unit 7, that is, the serial-to-parallel converter 2, the decoder 3, and the power supply circuit 5 and the drive circuit 6 included in the high-frequency switch circuit 4 are referred to generally as the power-supply/control circuit unit (low-frequency circuit unit) 10.

The individual layers constituting the semiconductor device 1 are stacked, for example, on a rectangular SOI substrate of a chip. In the schematic plan view of FIG. 1, the six pass-through FET groups 11-1 to 11-6 and the six shunt FET groups 12-1 to 12-6 within the SP6T switch are disposed in three lines along one side "A" of the substrate such that two pass-through FET groups and two shunt FET groups are disposed in each line. That is, arranged alongside "A" are the line formed by the pass-through FET groups 11-1 and 11-4 and the shunt FET groups 12-1 and 12-4, the line formed by the pass-through FET groups 11-2 and 11-5 and the shunt FET groups 12-2 and 12-5, and the line formed by the pass-through FET groups 11-3 and 11-6 and the shunt FET groups 12-3 and 12-6.

In each line, between two pass-through FET groups 11, a wiring pattern 15 is provided in a direction perpendicular to the corresponding line, so as to be connected to the RF_COM node ANT. Also, in each line, on both ends of two pass-through FET groups 11, two shunt FET groups 12 are disposed with pads RF for RF nodes interposed them and the two pass-through FET groups 11. That is, at each of the end portions of the pass-through FET groups 11-1 to 11-6, a corresponding one of the shunt FET groups 12-1 to 12-6 is disposed with a corresponding one of the pads RF1 to RF6 interposed therebetween.

Also, at the peripheral portion of the substrate surface, a first peripheral GND conductor (first ground conductor) 13 and a second peripheral GND conductor (second ground conductor) 14 are disposed so as to surround at least a portion of the switching unit 7 and the power-supply/control circuit unit 10. That is, the first peripheral GND conductor 13 and the second peripheral GND conductor 14 are disposed so as to surround the switching unit 7 and the power-supply/control circuit unit 10, and function as wiring patterns for protection against electro-static discharge (ESD).

More specifically, the first peripheral GND conductor 13 is disposed along three sides "A", "B" and "C" of the substrate. The ground nodes of three shunt FET groups 12-1 to 12-3 are disposed along the side "B" intersecting with the side "A", and the first peripheral GND conductor 13 is connected at a second position to those ground nodes. Also, a first GND pad (first ground portion) GND1 is disposed along the side "C" opposite to the side "B", and the first peripheral GND conductor 13 is connected to the first GND pad GND1. The conductor 13 is connected to the first GND pad GND1 at a first connection position and the first GND pad GND1 is connected to the ground node of the power-supply/control circuit unit 10.

Also, the first peripheral GND conductor 13 is connected to a second GND pad (second ground portion) GND2 near the second connection positions of the ground nodes of the shunt FET groups 12-1 to 12-3. The second GND pad GND2 is disposed apart from the first connection position of the first GND pad GND1 and the first peripheral GND conductor 13.

As described above, the first peripheral GND conductor 13 extends along three sides "A", "B", and "C" of the substrate from the connection positions with the ground nodes of the shunt FET groups 12-1 to 12-3 to the first GND pad GND1. Also, the first connection position of the first peripheral GND conductor 13 with the first GND pad GND1, and the connection position of the first peripheral GND conductor 13 with the second GND pad GND2 are set apart from each other as far as possible.

Additionally, the second peripheral GND conductor 14 is disposed along four sides "A", "B", "C", and "D" of the substrate. The ground nodes of three shunt FET groups 12-4 to 12-6 are disposed along the side "C" intersecting with the side "A", and the second peripheral GND conductor 14 is connected at a fourth connection position to those ground nodes. Also, a third GND pad (third ground portion) GND3 is disposed along the side "B" opposite to the side "C", and the second peripheral GND conductor 14 is connected at a third connection position to the third GND pad GND3. The conductor 14 is connected to the third GND pad GND3 and the third GND pad GND3 is connected to the ground node of the power-supply/control circuit unit 10.

Also, the second peripheral GND conductor 14 is connected to a fourth GND pad (fourth ground portion) GND4 near the fourth connection positions of the ground nodes of the shunt FET groups 12-4 to 12-6. That is, the fourth GND pad GND4 is connected to the second peripheral GND conductor 14 so as to be closer to the connection positions of the second peripheral GND conductor 14 and the ground nodes of the shunt FET groups 12-4 to 12-6 than to the connection position of the second peripheral GND conductor 14 and the third GND pad GND3.

As described above, the second peripheral GND conductor 14 extends along four sides "C", "B", "A", and "D" of the substrate from the connection positions with the ground nodes of the shunt FET groups 12-4 to 12-6 to the third GND pad GND3. Also, the connection position of the second peripheral GND conductor 14 with the third GND pad GND3 and the connection position of the second peripheral GND conductor 14 with the fourth GND pad GND4 are set apart from each other as far as possible.

In FIG. 1, the second peripheral GND conductor 14 is disposed along the side "D" of the substrate. However, the second peripheral GND conductor 14 may be disposed along three sides "C", "B", and "A" of the substrate, and the first peripheral GND conductor 13 may be disposed along four sides "A", "B", "D", and "C". Alternatively, both of the first peripheral GND conductor 13 and the second peripheral GND conductor 14 may be disposed along four sides of the substrate.

Bonding wires or solder bumps (not shown) are connected to the first to fourth GND pads GND1 to GND4, respectively, and the first to fourth GND pads GND1 to GND4 are connected to an external ground node by the bonding wires or solder bumps, by which a stable grounding process is performed.

Also, nodes (pads) RF1 to RF4 are electrically connected to different external high-frequency signal nodes through bonding wires or solder bumps (not shown), respectively. Further, the RF_COM node ANT is electrically connected to an antenna line through a bonding wire or a solder bump (not shown).

The pattern widths of the first peripheral GND conductor 13 and the second peripheral GND conductor 14 are set to, for example, 10 μm or less. The reason that the pattern widths of the first peripheral GND conductor 13 and the second peripheral GND conductor 14 are set to 10 μm or less is that as the parasitic inductance of the first peripheral GND conductor 13 and the second peripheral GND conductor 14 is too low in pattern widths greater than 10 μm, making it difficult to efficiently remove high-frequency noise flowing in those conductors by the parasitic inductance.

In the schematic plan view of FIG. 1, the first GND pad GND1 and the third GND pad GND3 are connected to both sides of the disposition area of the power-supply/control circuit unit 10 which may generate high-frequency noise, such that high-frequency noise generated by the power-supply/control circuit unit 10 is released externally through the first GND pad GND1 and the third GND pad GND3.

Also, if the individual components are disposed as shown in FIG. 1, the distance between the first GND pad GND1 and the second GND pad GND2 on the first peripheral GND conductor 13 is maximized, and similarly, the distance between the third GND pad GND3 and the fourth GND pad GND4 on the second peripheral GND conductor 14 is maximized. Therefore, it is possible to reduce high-frequency noise having been input from the power-supply/control circuit unit 10 to the first peripheral GND conductor 13 and the second peripheral GND conductor 14, by the parasitic inductance of the first peripheral GND conductor 13 and the second peripheral GND conductor 14. Therefore, the ground nodes of the shunt FET groups 12-1 to 12-6 are less influenced by high-frequency noise generated in the power-supply/control circuit unit 10.

That is, in the present embodiment, before high-frequency noise having been input from the first GND pad GND1 to the first peripheral GND conductor 13 reaches the second GND pad GND2, it is possible to reduce the high-frequency noise by the parasitic inductance of the first peripheral GND conductor 13. More specifically, high-frequency noise having reached the second GND pad GND2 while having been reduced by the parasitic inductance of the first peripheral GND conductor 13 is absorbed from the second GND pad GND2 to the external ground node to which a bonding wire or a solder bump (not shown) has been connected. Therefore, the high-frequency noise is substantially blocked from entering the ground nodes of the shunt FET groups 12, making it possible to stabilize the ground levels of the shunt FET groups 12. The same holds with respect to the second peripheral GND conductor 14.

Figure 4:
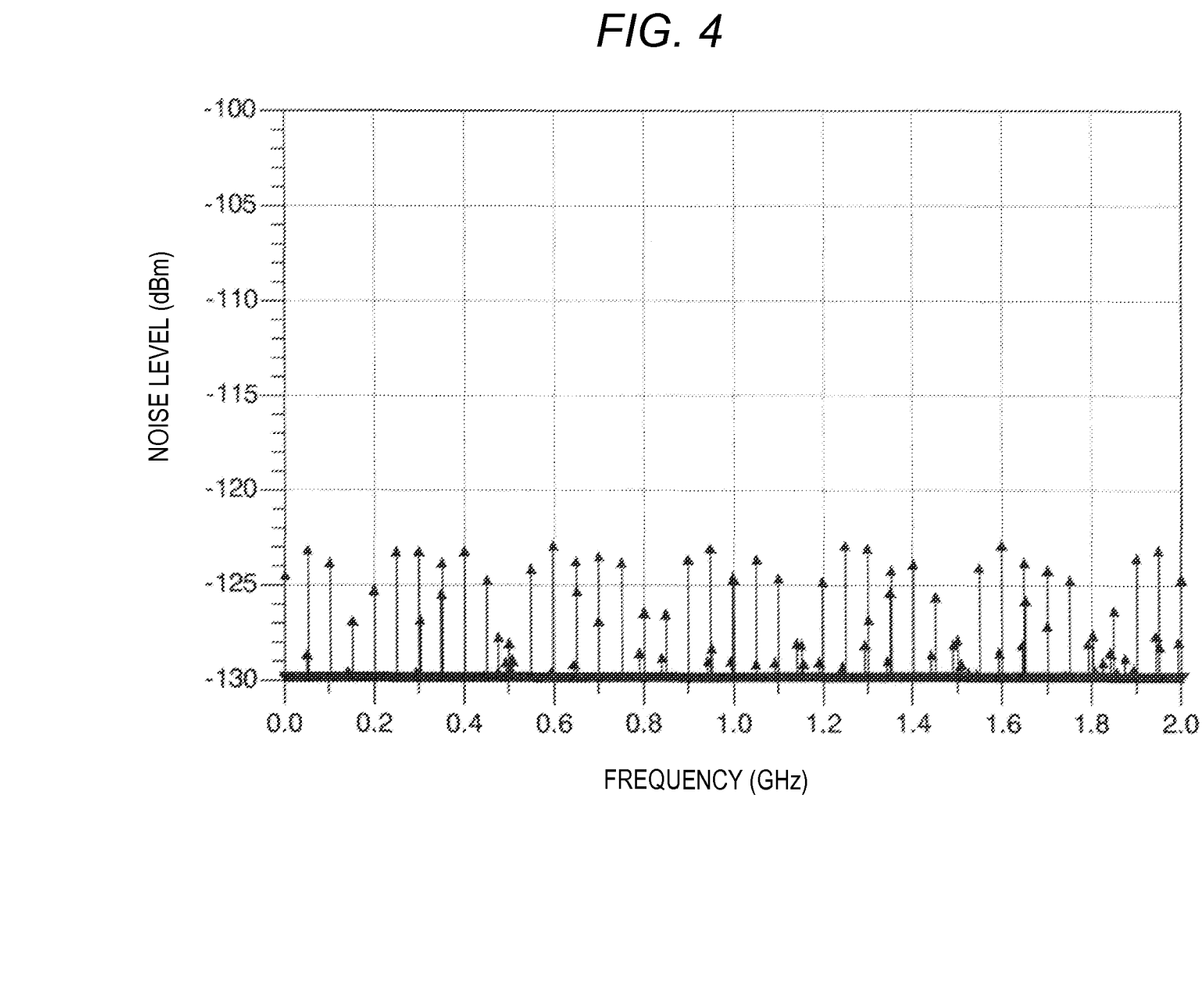
FIG. 4 is a view illustrating the noise spectrum at a RF_COM node of the semiconductor device of FIG. 1.

FIG. 4 is a view illustrating the noise spectrum at the RF_COM node ANT of the semiconductor device 1 of FIG. 1. The horizontal axis represents a signal frequency (GHz) and the vertical axis represents a noise level in Decibel-milliwatts (dBm). In general, if the noise level is −120 dBm or less, the amount of high-frequency noise is considered to be small. In the semiconductor device 1 of FIG. 1, the noise level is −120 dBm or less in every frequency band, and thus it may be seen that high-frequency noise is efficiently reduced.

Figure 5:
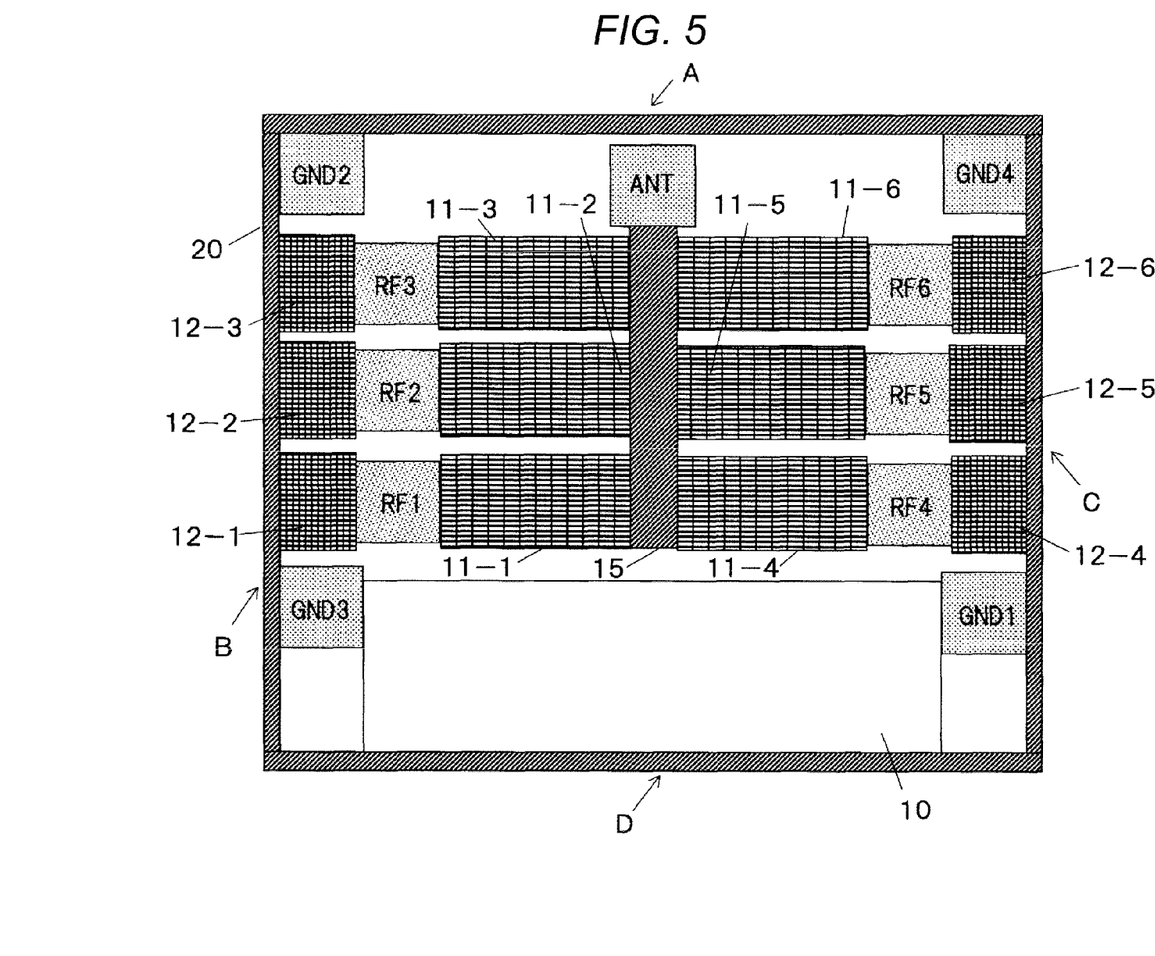
FIG. 5 is a schematic plan view of a comparative example.
Figure 6:
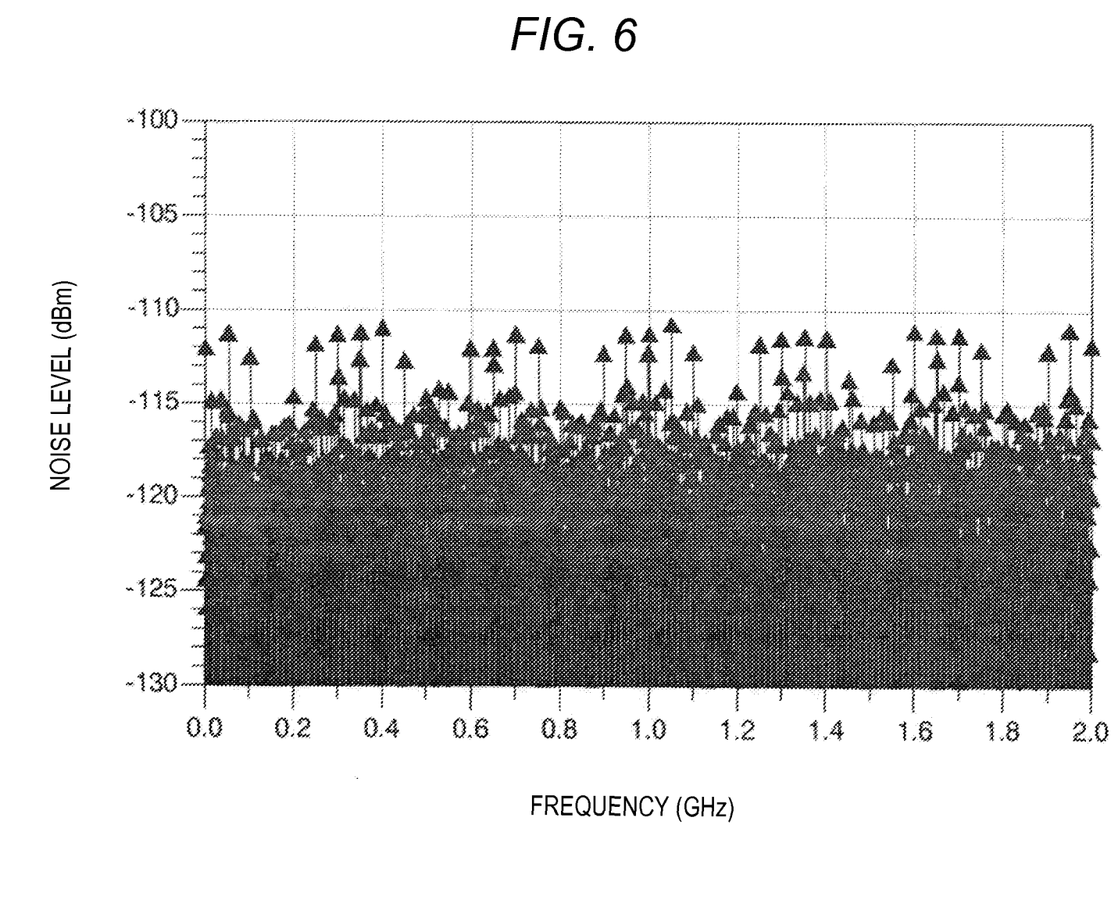
FIG. 6 is a view illustrating the noise spectrum of FIG. 5.

Meanwhile, FIG. 5 is a schematic plan view of a comparative example, and FIG. 6 is a view illustrating the noise spectrum of FIG. 5. The schematic plan view of FIG. 5 includes a peripheral GND conductor 20 completely surrounding the switching unit 7 and the power-supply/control circuit unit 10, instead of the first peripheral GND conductor 13 and the second peripheral GND conductor 14 of FIG. 1. The peripheral GND conductor 20 of FIG. 5 is disposed along the edges of four sides "A", "B", "D", and "C" of the substrate. The peripheral GND conductor 20 is provided mainly for protection against ESD, and has a pattern width of about 10 μm.

The peripheral GND conductor 20 is connected to the first to fourth GND pads GND1 to GND4 and the ground nodes of the shunt FET groups 12-1 to 12-6. However, the connection positions of the peripheral GND conductor 20 and the ground nodes of the shunt FET groups 12-4 to 12-6 are set very close to the connection position of the first GND pad GND1 and the peripheral GND conductor 20. Similarly, the connection positions of the peripheral GND conductor 20 and the ground nodes of the shunt FET groups 12-1 to 12-3 are set very close to the connection position of the third GND pad GND3 and the peripheral GND conductor 20. Therefore, in FIG. 5, of high-frequency noise generated in the power-supply/control circuit unit 10, noise overlapping the first GND pad GND1 easily flows into the ground nodes of the shunt FET groups 12-4 to 12-6 disposed close to the first GND pad GND1. Also, noise overlapping the third GND pad GND3 easily flows into the ground nodes of the shunt FET groups 12-1 to 12-3 disposed close to the third GND pad GND3. Therefore, as is apparent if FIGS. 4 and 6 are compared, in the comparative example shown in FIG. 5, the noise level increases considerably.

In the embodiment shown in FIG. 1, the amount of high-frequency noise is small, as shown in FIG. 4, due to the following two reasons. The first is that the first connection position of the first peripheral GND conductor 13 and the first GND pad GND1 connected to the power-supply/control circuit unit 10 is set apart, as far as possible from the second connection positions of the first peripheral GND conductor 13 and the ground nodes of the shunt FET groups 12-1 to 12-3. The second reason is that the second GND pad GND2 is disposed to be close to the second connection positions of the first peripheral GND conductor 13 and the ground nodes of the shunt FET groups 12-1 to 12-3 and as far as possible apart from the first GND pad GND1. Therefore, the chance that high-frequency noise input from the power-supply/control circuit unit 10 to the first GND pad GND1 will enter the ground nodes of the shunt FET groups 12-1 to 12-6 decreases. Also, high-frequency noise input from the first GND pad GND1 to the first peripheral GND conductor is reduced by the parasitic inductance of the first peripheral GND conductor 13, before reaching the second GND pad GND2. This feature is the same with respect to the second peripheral GND conductor 14.

Figure 7:
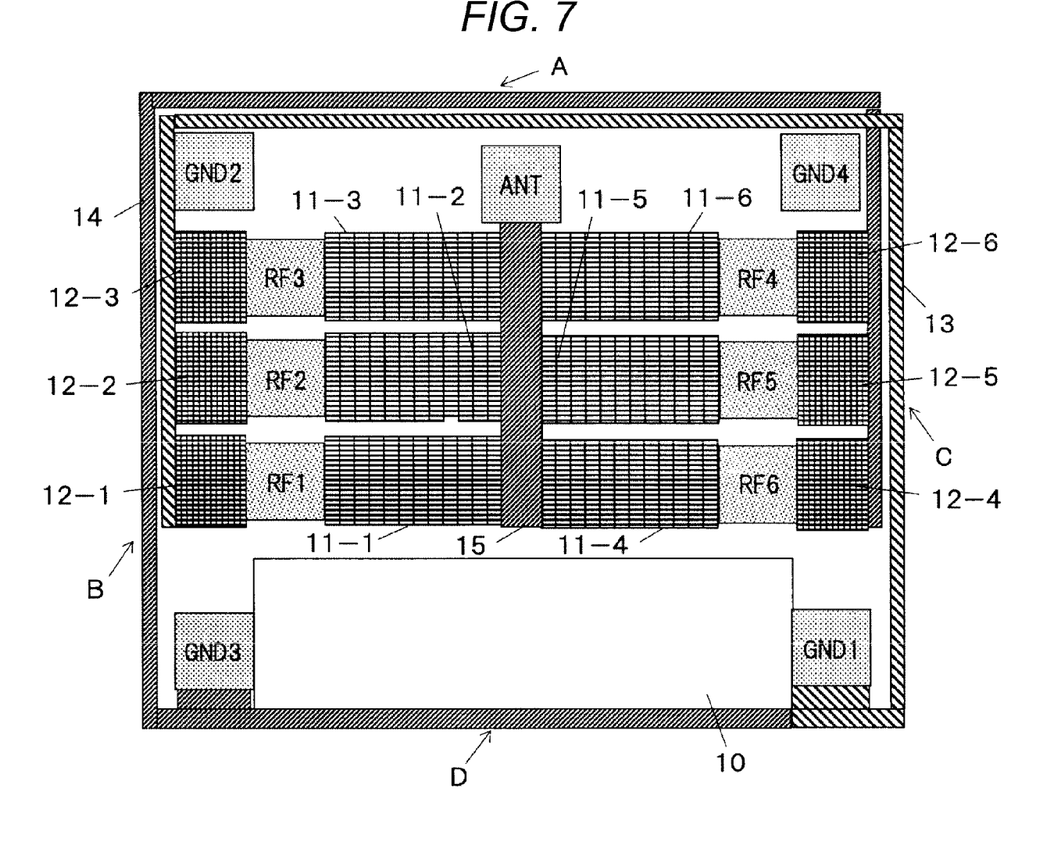
FIG. 7 is a schematic plan view of a first modification of the embodiment.

The schematic plan view of the semiconductor device 1 according to the present embodiment is not limited to that shown in FIG. 1. FIG. 7 is a schematic plan view of a first modification of the present embodiment. FIG. 7 is different from FIG. 1 in the positions of the first GND pad GND1 and the third GND pad GND3. In FIG. 7, the first GND pad GND1 and the third GND pad GND3 are disposed along the side "D" disposed to face the side "A" of the substrate, and the second peripheral GND conductor 14 is disposed not only along the sides "A", "B", and "C" of the substrate but also along the side "D". Also, on the side "D" side, both the first GND pad GND1 and the third GND pad GND3 are connected to the second peripheral GND conductor 14 and the first peripheral GND conductor 13, respectively.

According to FIG. 7, the distance between the first GND pad GND1 and the second GND pad GND2 on the first peripheral GND conductor 13 becomes greater than that of FIG. 1. Similarly, the distance between the third GND pad GND3 and the fourth GND pad GND4 on the second peripheral GND conductor 14 becomes greater than that of FIG. 1. Therefore, it is possible to more efficiently reduce high-frequency noise flowing in the first peripheral GND conductor 13 and the second peripheral GND conductor 14, by the parasitic inductance of the first peripheral GND conductor 13 and the second peripheral GND conductor 14.

Figure 8:
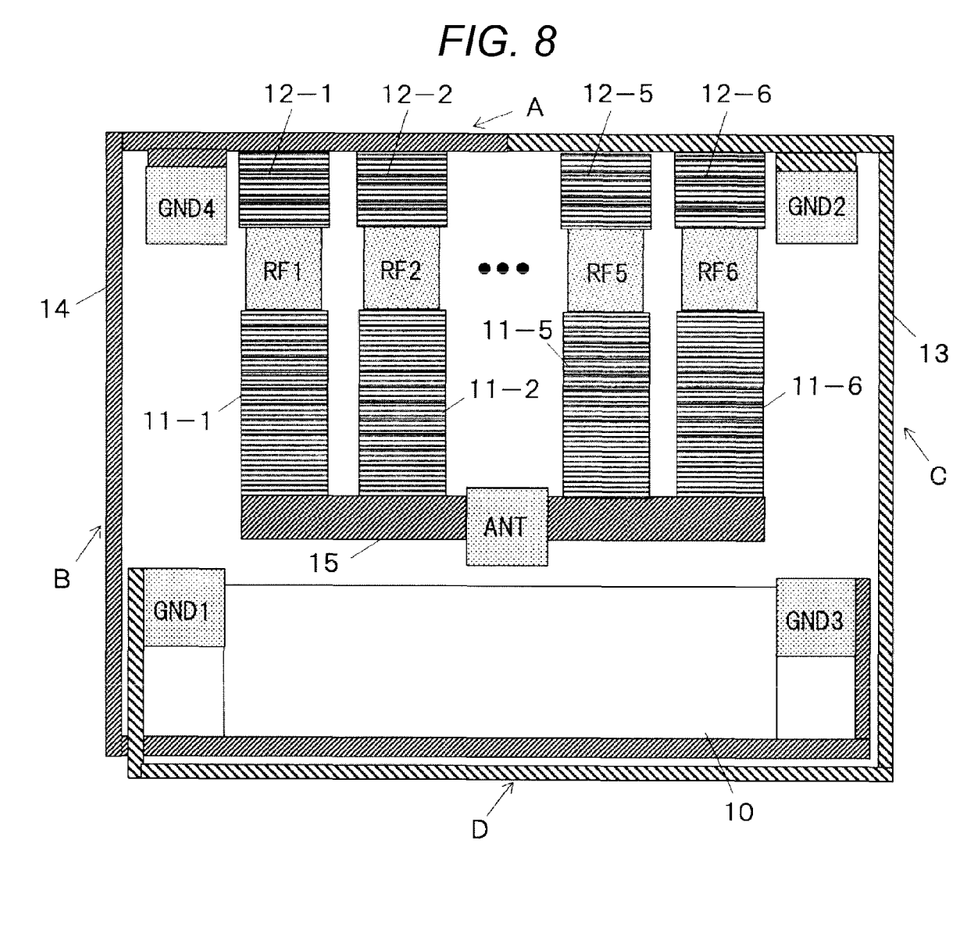
FIG. 8 is a schematic plan view of a second modification of the embodiment.

FIG. 8 is a schematic plan view of a second modification of the present embodiment. In FIG. 8, all shunt FET groups 12-1 to 12-6 are disposed in a line along the side "A" of the substrate, and the power-supply/control circuit unit 10 is disposed along the side "D" opposite side "A". On side "A", the first peripheral GND conductor 13 is connected to the ground nodes of the shunt FET groups 12-4 to 12-6 and the second GND pad GND2. In addition, on side "B", the first peripheral GND conductor 13 is connected to the first GND pad GND1. On side "A", the second peripheral GND conductor 14 is connected to the ground nodes of the shunt FET groups 12-1 to 12-3 and the fourth GND pad GND4. In addition, on side "C", the second peripheral GND conductor 14 is connected to the third GND pad GND3. Even in the second modification, the first GND pad GND1 and the second GND pad GND2 connected to the first peripheral GND conductor 13 are sufficiently apart from each other. Similarly, the third GND pad GND3 and the fourth GND pad GND4 connected to the second peripheral GND conductor 14 are sufficiently apart from each other. Therefore, it is possible to achieve the same effects as those of the first modification.

Figure 9:
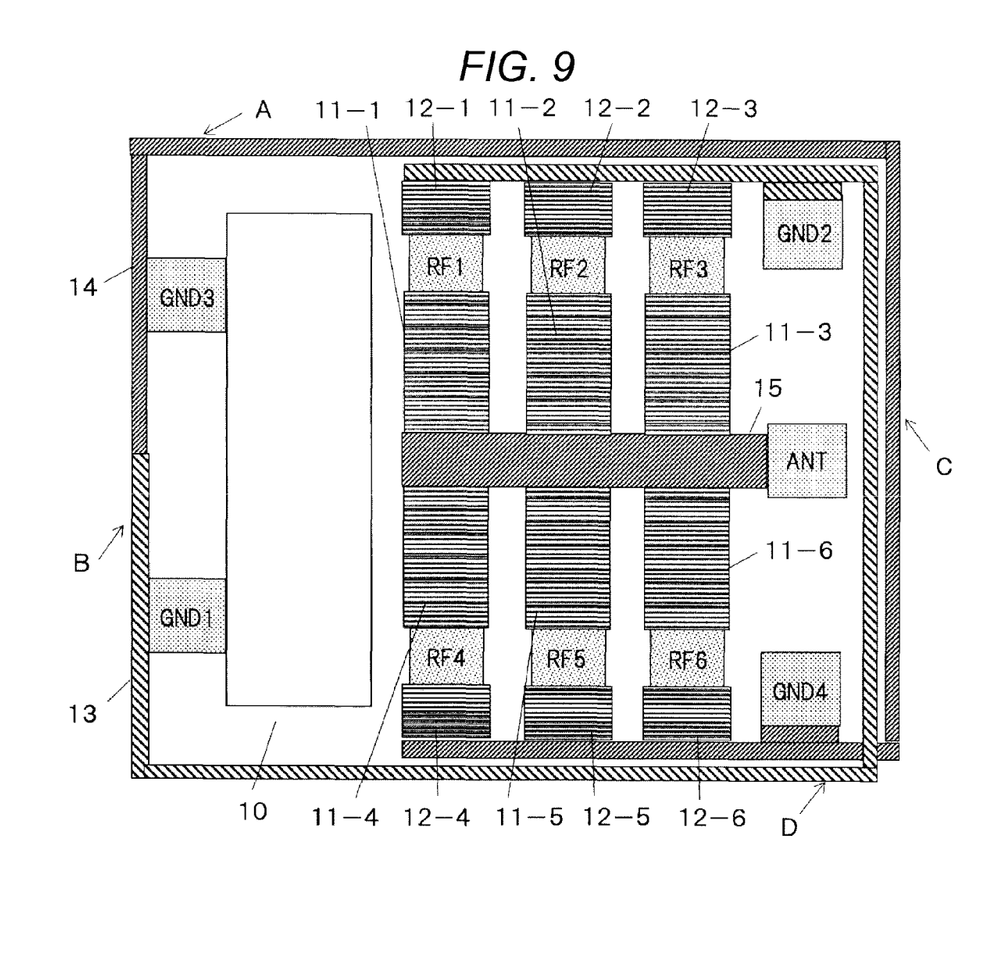
FIG. 9 is a schematic plan view of a third modification of the embodiment.

FIG. 9 is a schematic plan view of a third modification of the present embodiment. In FIG. 9, the longitudinal direction of the power-supply/control circuit unit 10 is disposed along the side "B". The shunt FET groups 12-1 to 12-3 are disposed along the side "A", and the shunt FET groups 12-4 to 12-6 are disposed along the side "D". The first peripheral GND conductor 13 is connected to the first GND pad GND1 on the side "B", extends from the side "B" to the side "A" via the sides "D" and "C", and is connected to the second GND pad GND2 and the ground nodes of the shunt FET groups 12-1 to 12-3 on side "A". The second peripheral GND conductor 14 is connected to the third GND pad GND3 on the side "B", extends from the side "B" to the side "D" via the sides "A" and "C", and is connected to the fourth GND pad GND4 and the ground nodes of the shunt FET groups 12-4 to 12-6 on the side "D". Even in the third modification, it is possible to achieve the same effects as those of the first and second modifications.

As described above, in the present embodiment, at the peripheral portion of the substrate surface, the first peripheral GND conductor 13 and the second peripheral GND conductor 14 provide protection against ESD. On the first and second peripheral GND conductors 13 and 14, the connection positions with the ground node of the power-supply/control circuit unit 10 and the connection positions with the ground nodes of the shunt FET groups 12-1 to 12-6 are set apart as far as possible from each other. Therefore, high-frequency noise generated in the power-supply/control circuit unit 10 is substantially blocked from entering the ground nodes of the shunt FET groups 12-1 to 12-6, and the switching unit 7 is substantially immune from interference by high-frequency noise.

In the above described each embodiment, the first peripheral GND conductor 13 and the second peripheral GND conductor 14 are disposed along the outer edge of the substrate. However, in a case where the numbers of pass-through FET groups 11 and shunt FET groups 12 are small, only one peripheral GND conductor (connection conductor) may be disposed along the outer edge of the substrate. Even in this case, it is possible to set the connection position of the peripheral GND conductor and the ground node of the power-supply/control circuit unit 10 as far as possible apart from the connection positions of the peripheral GND conductor and the ground nodes of the shunt FET groups.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a switching unit provided on a substrate, and connected to a high-frequency signal node and a ground node;
a low-frequency circuit provided on the substrate;
a first ground portion connected to a ground node of the low-frequency circuit;
a ground conductor provided on the substrate, connected to the first ground portion at a first connection position and connected to the ground node of the switching unit at a second connection position; and
a second ground portion connected to the ground conductor, the second ground portion being closer to the second connection position than the first connection position.

2. The semiconductor device according to claim 1, wherein the substrate has four sides, and the ground conductor extends along at least three sides of the substrate from the ground node of the switching unit to the first ground portion.

3. The semiconductor device according to claim 2, wherein the second ground portion and the second connection position are provided along the same side of the substrate.

4. The semiconductor device according to claim 1, wherein the ground conductor is routed along the periphery of the substrate, and has a wiring pattern with a predetermined width of 10 μm or less.

5. The semiconductor device according to claim 1, wherein the ground conductor is closer to an edge of the substrate than to positions of the switching unit and the low-frequency circuit on the substrate.

6. The semiconductor device according to claim 1, further comprising:
a third ground portion connected to another ground node of the low-frequency circuit, and connected to the ground conductor at a third connection position; and
a fourth ground portion that is closer to a fourth connection position at which the ground conductor and another ground node of the switching unit is connected, than to the third connection position.

7. The semiconductor device according to claim 6,
wherein the switching unit includes a plurality of switching circuits, each configured to selectively couple a plurality of high-frequency signal nodes to a plurality of ground nodes, respectively,
wherein a first portion of the plurality of ground nodes of the plurality of switching circuits is connected at the second connection position and a second portion of the plurality of ground nodes of the plurality of switching circuits is connected at the fourth connection position.

8. The semiconductor device according to claim 6,
wherein the ground conductor includes a first conductor and a second conductor that are connected to each other; and
wherein each of the first conductor and the second conductor extends along at least three sides of the substrate.

9. The semiconductor device according to claim 6,
wherein the ground conductor includes a first conductor and a second conductor that are connected to each other; and
wherein each of the first conductor and the second conductor extends along at least two sides of the substrate and a portion of a third side of the substrate.

10. The semiconductor device according to claim 9, wherein the first and second conductors separately traverse one side of the substrate that is opposite to the third side of the substrate.

11. The semiconductor device according to claim 6, wherein the low-frequency circuit includes:
a serial-to-parallel converter configured to convert serial signals into parallel signals; and
a drive circuit configured to generate switching control signals for controlling switching of the plurality of switching circuits, based on the parallel signals.

12. A semiconductor device comprising:
a ground conductor provided on a substrate;
a first circuit provided on the substrate and having a ground node;
a first ground portion connected to the ground node of the first circuit and the ground conductor at a first connection position;
a second circuit provided on the substrate and having a ground node connected to the ground conductor at a second connection position; and
a second ground portion connected to the ground conductor, and being closer to the second connection position than to the first connection position.

13. The semiconductor device according to claim 12, wherein the ground conductor traverses along a periphery of the substrate, and has a wiring pattern with a predetermined width of 10 μm or less.

14. The semiconductor device according to claim 12,
wherein the substrate has four sides; and
wherein the ground conductor includes a first ground conductor and a second ground conductor connected to each other, each of the first and second ground conductors separately traversing the substrate on three sides of the substrate.

15. The semiconductor device according to claim 14,
wherein the substrate has four sides; and
wherein the ground conductor includes a first ground conductor and a second ground conductor connected to each other, each of the first and second ground conductors traversing the substrate on the same three sides of the substrate.

16. The semiconductor device according to claim 12,
wherein the substrate is rectangular in shape and has four sides.

17. The semiconductor device according to claim 16,
wherein the ground conductor includes a first ground conductor and a second ground conductor;
wherein the first conductor traverses the substrate along the first side and the second side and a portion of the third side;
wherein the second conductors traverses the substrate along the second side the third side and a portion of the first side; and
wherein the first and second conductors connect to each other on the fourth side.

18. The semiconductor device according to claim 17,
wherein the second circuit includes a plurality of ground nodes;
wherein the plurality of ground nodes of the second circuit includes a first set of ground nodes and a second set of ground nodes;
wherein the first set of ground nodes is adjacent to the fourth side and connected to the first ground conductor; and
wherein the second set of ground nodes is adjacent to the fourth side and connected to the second ground conductor.

19. A method for reducing the coupling of noise from a first circuit to a second circuit, each circuit having a ground node and being provided on a common substrate, the method comprising:
providing a ground conductor;
connecting the ground node of the first circuit to a first ground portion;
coupling the first ground portion to the ground conductor at a first connection point;
coupling the ground node of the second circuit to the ground conductor at second connection point; and
providing a second ground portion connected to the ground conductor, wherein second ground portion is closer to the second connection position than the first connection position.

20. The method of claim 19, wherein the ground conductor is a peripheral ground conductor, and has a wiring pattern with a predetermined width of 10 μm or less.

* * * * *